United States Patent
Ambal et al.

(10) Patent No.: US 8,772,682 B2
(45) Date of Patent: Jul. 8, 2014

(54) METHODS AND APPARATUS FOR CONTROLLING TEMPERATURE OF A MULTI-ZONE HEATER IN A PROCESS CHAMBER

(71) Applicant: Applied Materials, Inc., Santa Clara, CA (US)

(72) Inventors: Hari Kishore Ambal, San Jose, CA (US); Uwe Paul Haller, San Jose, CA (US); Jianhua Zhou, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/874,603

(22) Filed: May 1, 2013

(65) Prior Publication Data

US 2013/0270252 A1    Oct. 17, 2013

Related U.S. Application Data

(63) Continuation of application No. 13/113,015, filed on May 20, 2011.

(51) Int. Cl.
*H05B 3/06* (2006.01)
*C23C 16/00* (2006.01)

(52) U.S. Cl.
USPC ............ 219/520; 219/390; 392/416; 118/724

(58) Field of Classification Search
USPC .......... 219/390, 405, 411, 520; 392/416, 418; 118/724, 725, 50.1
See application file for complete search history.

(56) References Cited

U.S. PATENT DOCUMENTS

| | | | |
|---|---|---|---|
| 6,184,498 B1* | 2/2001 | Kiyama | 219/390 |
| 6,469,283 B1 | 10/2002 | Burkhart et al. | |
| 7,126,091 B1 | 10/2006 | Westfall | |
| 2006/0291132 A1 | 12/2006 | Kanno et al. | |
| 2007/0292598 A1 | 12/2007 | Tada et al. | |
| 2008/0236492 A1 | 10/2008 | Yamazawa | |

FOREIGN PATENT DOCUMENTS

JP        10-116885 A        5/1998

OTHER PUBLICATIONS

International Search Report and Written Opinion mailed Oct. 29, 2012 for PCT Application No. PCT/US2012/038294.

* cited by examiner

*Primary Examiner* — Shawntina Fuqua
(74) *Attorney, Agent, or Firm* — Moser Taboada; Alan Taboada

(57) ABSTRACT

Methods and apparatus for controlling the temperature of multi-zone heater in a process chamber are provided herein. In some embodiments, a method is provided to control a multi-zone heater disposed in a substrate support, wherein the multi-zone heater has a first zone and a second zone. In some embodiments, the method may include measuring a current drawn by the first zone at a first time; measuring a voltage drawn by the first zone at the first time; calculating the resistance of the first zone based upon the measured current and voltage drawn by the first zone at the first time; determining a temperature of the first zone based upon a predetermined relationship between the resistance and the temperature of the first zone; and adjusting the temperature of the first zone in response to the temperature determination.

15 Claims, 3 Drawing Sheets

METHODS AND APPARATUS FOR CONTROLLING TEMPERATURE OF A MULTI-ZONE HEATER IN A PROCESS CHAMBER

CROSS-REFERENCE TO RELATED APPLICATIONS

This application is a continuation of co-pending U.S. patent application Ser. No. 13/113,015, filed May 20, 2011, which is herein incorporated by reference.

FIELD

Embodiments of the present invention generally relate to semiconductor processing and, more particularly, to methods and apparatus for controlling the temperature of a multi-zone heater in a process chamber.

BACKGROUND

Within a process chamber of a semiconductor processing system, a substrate is typically supported by a substrate support while being processed. In many such systems, the substrate support is heated to raise the temperature of the substrate during one or more of the process steps. The heater is generally a coil of resistive wire or a metalized layer. When current is applied to this wire or layer, the heater generates heat that is conductively transferred through the substrate support to the substrate.

In some cases, a single zone heater is used to heat a substrate. The disadvantage of using a single zone-heater is that the center of a single zone heater is typically hotter than the outer edges of the single zone heater, which can result in non-uniform deposition of material onto the substrate. A multi-zone heater can provide more uniform heat to a substrate. However, a disadvantage of a multi-zone heater is that the temperature of a multi-zone heater, and thus the amount of heat transferred to the substrate is difficult to measure and control. For example, one approach used to determine the temperature of an outer zone of a multizone heater is to monitor an amount of power being delivered to an inner zone of the heater, to multiply the power by an experimentally calculated power ratio, and then to apply that power to the outer zone. However, the accuracy of this methodology is affected by varying process conditions within the process chamber of a semiconductor processing system.

Thus, the inventors have provided improved methods and apparatus for controlling the temperature of multi-zone heater in a process chamber.

SUMMARY

Methods and apparatus for controlling the temperature of multi-zone heater in a process chamber are provided herein. In some embodiments, a method is provided to control a multi-zone heater disposed in a substrate support, wherein the multi-zone heater has a first zone and a second zone. In some embodiments, the method may include measuring a current drawn by the first zone at a first time; measuring a voltage drawn by the first zone at the first time; calculating the resistance of the first zone based upon the measured current and voltage drawn by the first zone at the first time; determining a temperature of the first zone based upon a predetermined relationship between the resistance and the temperature of the first zone; and adjusting the temperature of the first zone in response to the temperature determination.

An apparatus according to at least some embodiments of the present invention may include a multizone heater disposed in a substrate support; a power source providing a first power feed to a first zone of the multizone heater and providing a second power feed to a second zone of the multizone heater; a resistance measuring device coupled to the first power feed to simultaneously measure the current and voltage drawn by the first zone; and a controller coupled to the power source and the resistance measuring device to control the power source in response to data received from the resistance measuring device.

Other embodiments and variations are discussed below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
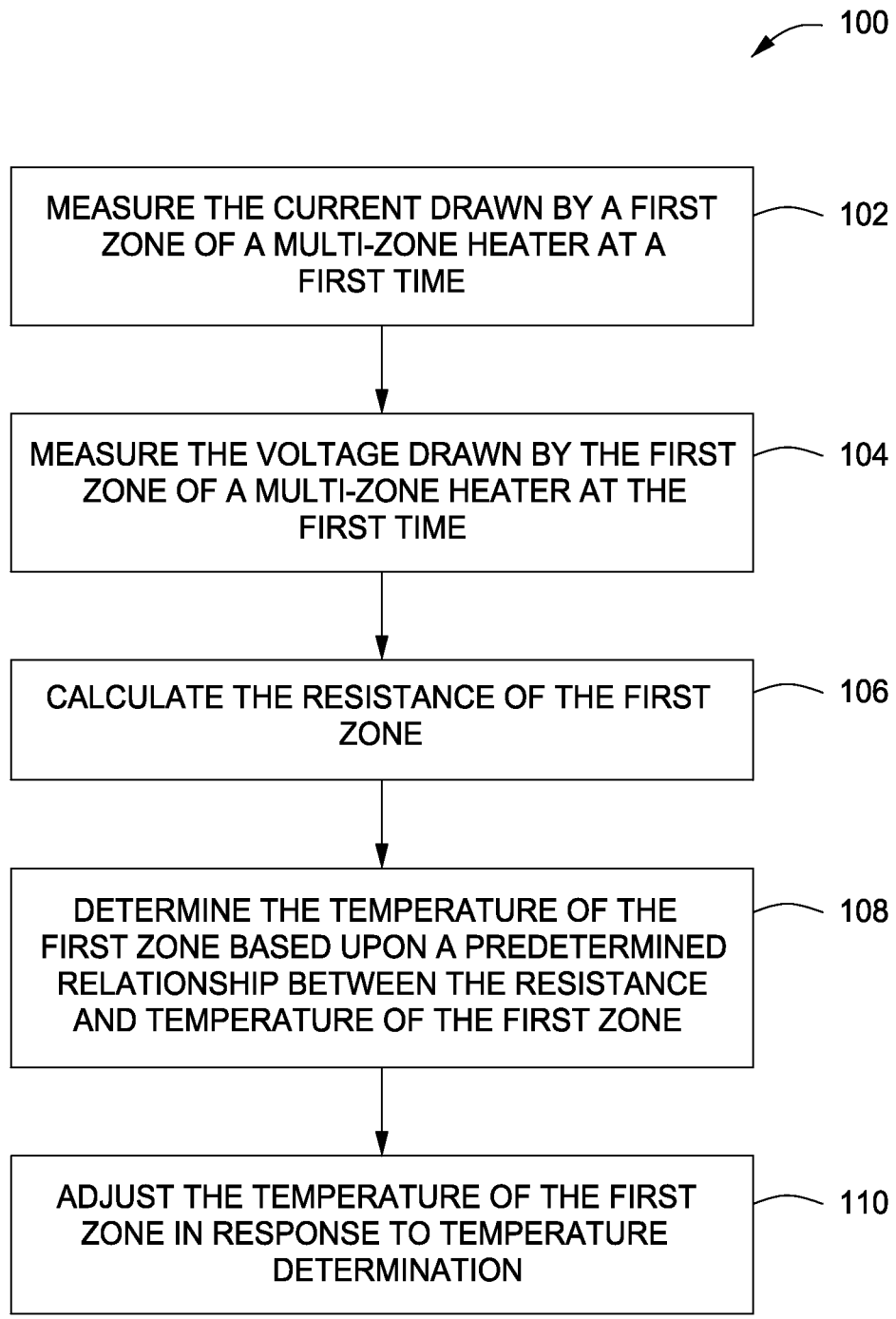
FIG. 1 depicts a method of controlling the temperature of a multi-zone heater in a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of some embodiments may be beneficially incorporated in other embodiments without further recitation.

DETAILED DESCRIPTION

Embodiments of the present invention provide methods and apparatus for controlling the temperature of multi-zone heater in a process chamber. At least some embodiments of the present invention may advantageously provide flexibility to have a center cold profile or a center hot profile on a substrate during processing.

Figure 2A:
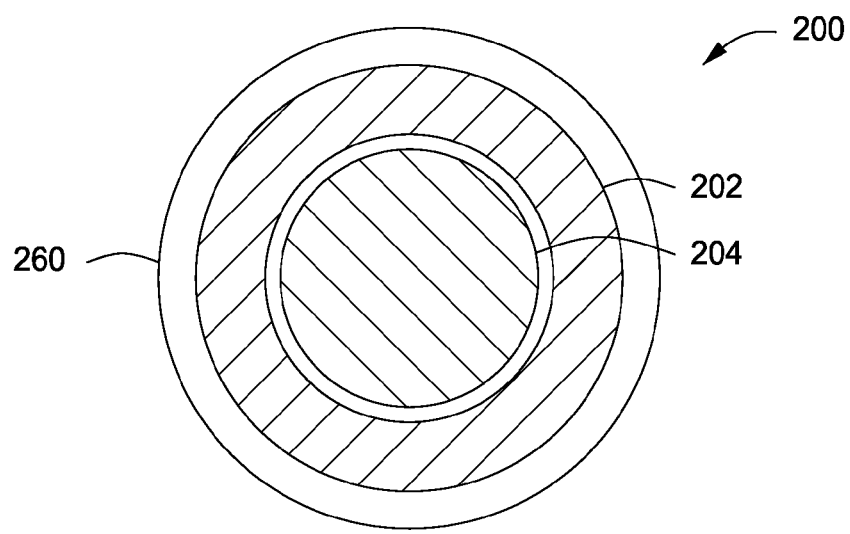
FIG. 2A depicts a cross-sectional plan view of a multi-zone heater in accordance with some embodiments of the present invention.
Figure 2B:
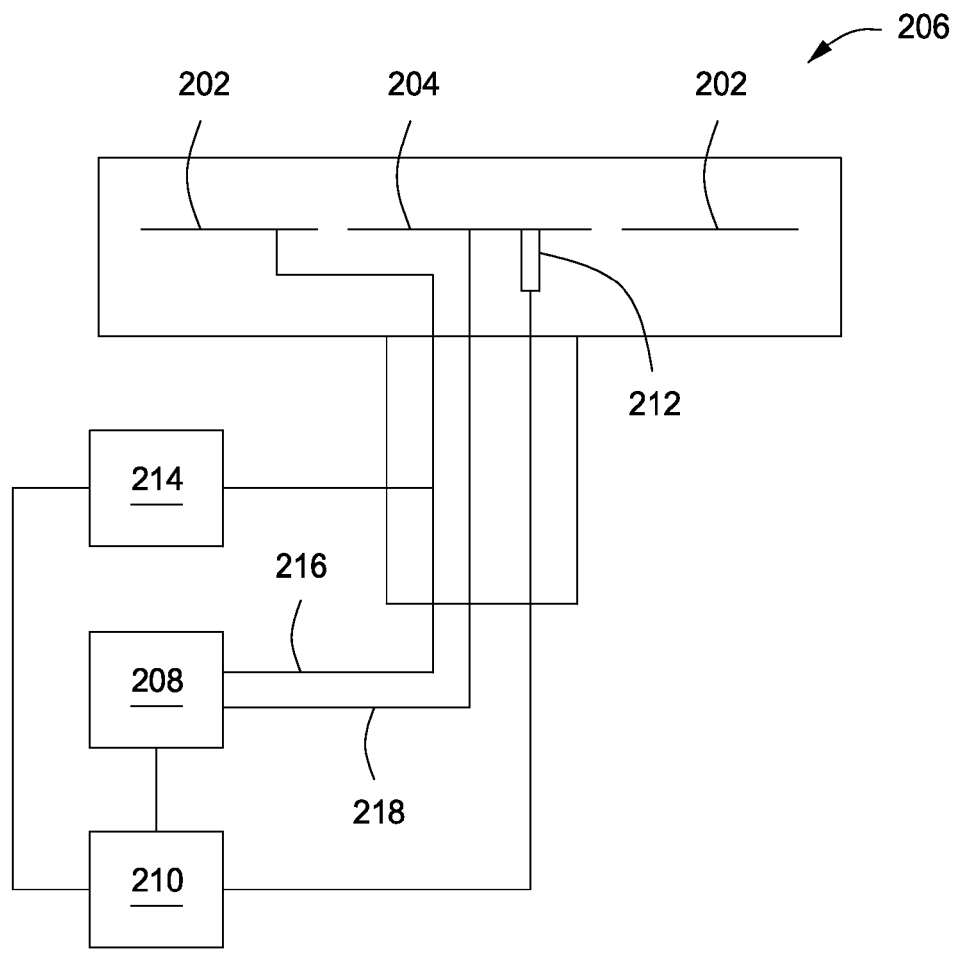
FIG. 2B depicts a schematic side view of a multi-zone heater within a substrate support in accordance with some embodiments of the present invention.
Figure 3:
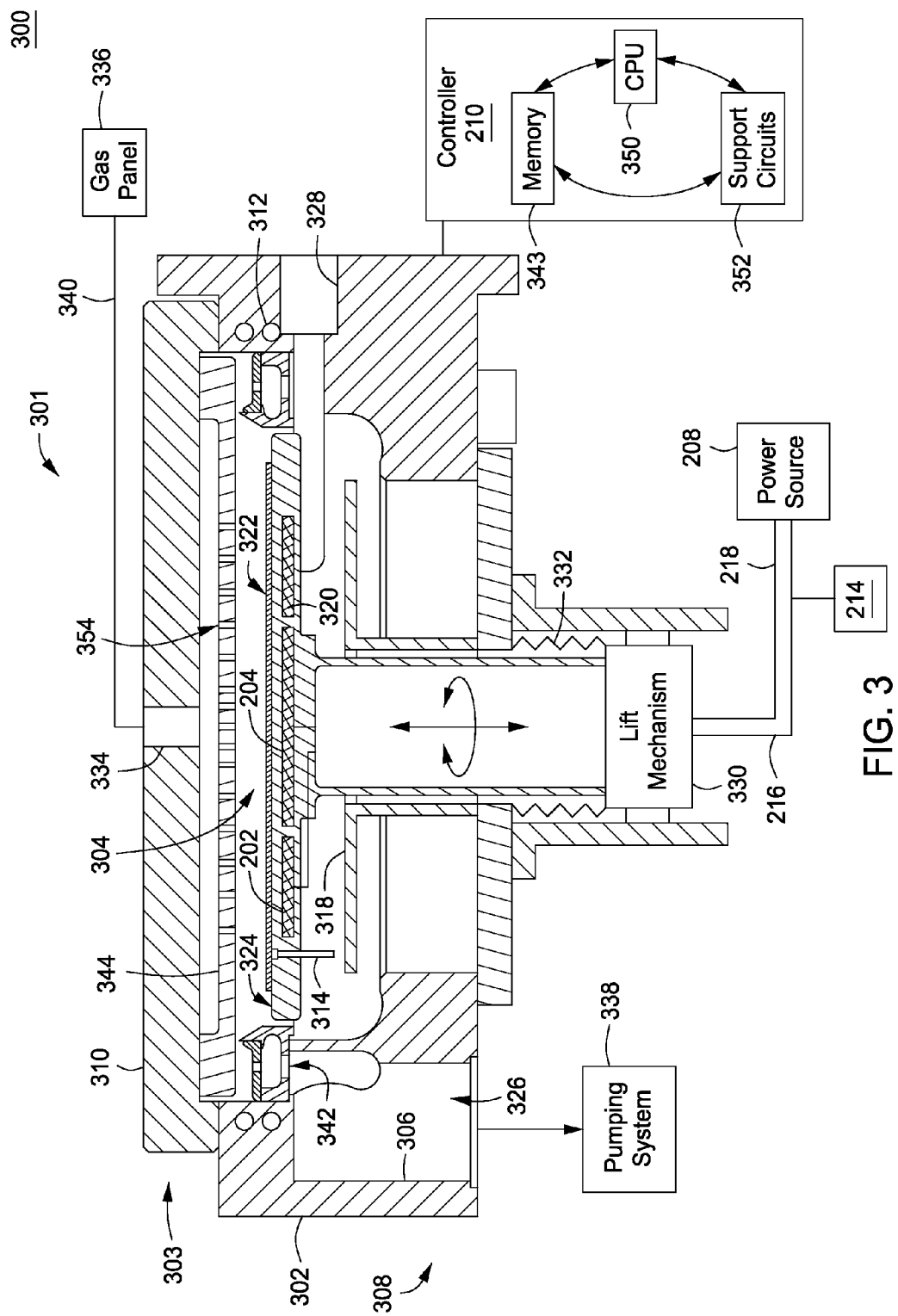
FIG. 3 depicts a schematic diagram of an exemplary chemical vapor deposition ("CVD") reactor of the kind that may be used to practice portions of the method of FIG. 1 in accordance with some embodiments of the present invention.

FIG. 1 is a flow diagram of one embodiment of a method 100 for controlling the temperature of multi-zone heater in a process chamber. FIG. 2A depicts a cross sectional top view of a multi-zone heater in accordance with some embodiments of the present invention. FIG. 2B depicts a schematic side view of a multi-zone heater within a substrate support in accordance with some embodiments of the present invention. FIG. 3 depicts a schematic diagram of an exemplary chemical vapor deposition ("CVD") reactor of the kind that may be used to practice portions of the method of FIG. 1 in accordance with some embodiments of the present invention.

The method 100 begins at 102, by measuring the current drawn by the first zone of a multi-zone heater at a first time. In addition, as shown at 104, the voltage drawn by the first zone of the multi-zone heater is also measured at the first time.

In some embodiments, the multi-zone heater 200 has heater elements arranged into at least a first zone 202 and a second zone 204, as depicted in FIG. 2A. In some embodiments, the first zone 202 and the second zone 204 are disposed within a substrate support 206 and connected to a power source 208, as depicted in FIG. 2B. In some embodiments, as depicted in FIGS. 2A and 2B, the first zone 202 is an outer zone and the second zone 204 is an inner zone disposed within the outer zone. The inner and outer zones may substantially correspond to inner and outer portions of a substrate to be supported on the substrate support 206. In some embodiments, the power source 208 is an about 190 to about 240 VAC, or about 208 VAC power source. Power sources of other sizes may also be used dependent upon the application and design of the apparatus. In some embodiments, the AC power source 208 runs at a 60 Hz cycle. In some embodiments, as depicted in FIG. 2B, the power source 208 supplies a first power feed 216 to the first zone 202 and supplies a second power feed 218 to the second zone 204. In some embodiments, the temperature of the second zone 204 is measured using a thermocouple 212. The thermocouple 212 is connected to a controller 210 (described in more detail below with respect to FIG. 3), which is further connected to the power source 208.

The current and voltage drawn by the first zone 202 may be measured using a resistance measuring device 214 capable of measuring the current and the voltage simultaneously, e.g., at the first time. As used herein, simultaneously, or at the first time, includes measurements made within the range of up to about 110 milliseconds of each other. In some embodiments, the resistance measuring device 214 may be a high frequency Hall effect current sensor (e.g., having an about 200 kHz or greater sampling rate) to capture the instantaneous current being delivered to the first zone 202 as well as the applied voltage. For example, in some embodiments, the resistance measuring device 214 may be one of the PQube® line of power monitors available from Power Standards Lab (PSL), of Alameda, Calif.

In some embodiments, the resistance measuring device 214 is coupled to the first power feed 216 to measure the current and voltage drawn by the first zone 202. In some embodiments, a plurality of sets of measurements of the voltage and current drawn by the first zone 202 are taken. For example, a plurality of sets of measurements of the voltage and current drawn by the first zone 202 may be taken for every cycle of the power source 208, wherein each set of measurements includes a measurement of the voltage and a measurement of the current taken simultaneously (e.g., within about 110 milliseconds of each other). In some embodiments, 256 measurements of the voltage and current drawn by the first zone 202 are taken for every cycle of the power source 208.

The resistance measuring device 214 may also be coupled to the controller 210. In some embodiments, the controller 210 can detect a 16 milliohm change in the resistance of the first zone 202, which is equivalent to a 1 degree Celsius change in temperature in the first zone 202. In some embodiments, the resistance measuring device 214 and the controller 210 may be integrated (e.g., may be provided in the same housing or device).

At 106, the resistance of the first zone 202 may be calculated. The resistance may be calculated using Ohm's Law, which provides that resistance is equal to voltage divided by current (R=V/I). In some embodiments, the resistance value may be calculated every 100 to 110 milliseconds. In some embodiments, a longer period may be provided between recalculations of the resistance value, however, providing more rapid recalculations advantageously facilitates more rapidly determining the temperature, which may be critical to accurately determine the temperature during shorter processes, which may have a duration as short as about 5 seconds. In some embodiments, the resistance value may be calculated within about 100 milliseconds of the first time (e.g., within about 100 ms of the measurement of the current and voltage). The inventors have discovered that the supply voltage from the facilities plays a major factor which determines the rms (root mean squared) value of voltage needed to calculate the resistance. In some facilities, the supply voltage may be 208 VAC, but different facilities, for example in different countries, may have different supply voltages. Thus, the inventors have provided a technique to monitor the supply voltage at the same time as the current to more accurately calculate the resistance of the heater zone.

At 108, the temperature of the first zone 202 may be determined based upon a predetermined relationship between the resistance and the temperature of the first zone 202. The current and voltage must both be measured at the first time to ensure the accuracy of the calculated resistance value. As the resistance of the heater is directly related to its temperature in a linear relationship, the accuracy of the resistance calculation is directly related to the accuracy of the temperature determination. In some embodiments, the resistance of the first zone 202 can be used to correlate the temperature of the first zone 202 to an accuracy of within about 0.5° C. In some embodiments, the predetermined relationship between the resistance and the temperature of the first zone 202 may be determined empirically or by modeling. In some embodiments, the predetermined relationship between the resistance and the temperature of the first zone 202 may be determined empirically by bringing the first zone 202 to a desired temperature and measuring the resistance of the first zone 202. The resistance measurement may also be recorded over a range of temperatures. In some embodiments, the first zone 202 may be brought to the desired temperature while the second zone 204 is also brought to a desired temperature (which may be the same or different than the desired temperature of the first zone 202).

For example, in some embodiments, the method 100 may take place in a chemical vapor deposition chamber, such as described in FIG. 3, with varying process parameters, such as pressure and gas flow rate, which can induce a swing in the temperature of the first zone 202. In such embodiments, the resistance can be used to correlate the temperature of the first zone 202 to an accuracy of within 2.5° C. This level of control over the multi-zone heater allows for a more constant temperature profile across a substrate as compared to conventional methods. In addition, in embodiments where the zones physically change position due to thermal expansion and contraction, using a resistance calculation to determine the temperature of a zone may advantageously enable or facilitate more accurate zone temperature measurement and operation. For example, in conventional apparatus, thermocouples may be used to measure the temperature of the heater. However, a disadvantage of conventional dual-zone heater configurations having inner and outer zones is that a thermocouple cannot be placed on the outer zone due to thermal movement of the outer zone during operation.

At 110, the temperature of the first zone 202 may be adjusted in response to the temperature determination based upon the predetermined relationship between the resistance and the temperature of the first zone 202. In some embodiments, the temperature of the first zone 202 can be reduced to be cooler than the temperature of the second zone 204, for example, to mimic a single-zone heater. Alternatively, the temperature of the first zone 202 can be increased to be hotter than the temperature of the second zone 204. In some embodiments, the temperature of the first zone 202 can be adjusted to maintain a temperature differential between the first zone 202 and the second zone 204. For example, in some embodiments, the second zone 204 may be maintained at a higher temperature than the first zone 202, for example, by up to about 40 degrees hotter. In some embodiments, the second zone 204 may be maintained at a lower temperature than the first zone 202, for example, by up to about 15 degrees cooler. In some embodiments, the first zone 202 may be heated to a first temperature, for example about 200° C., and once the first temperature is reached, the second zone 204 may be heated to the desired second temperature. In some embodiments, once the second zone 204 is heated to the desired second temperature, the first and second zones 202, 204 may be ramped up together to a desired third temperature.

Thus, using embodiments of the methods described above, the present invention advantageously provides flexibility to control the temperature profile of a multi-zone heated substrate support (and thus, a substrate disposed thereon) to be uniform, or to be controllably non-uniform. For example, in some embodiments, a uniform thermal profile may be provided. Alternatively, a center cold profile or a center hot profile may be provided.

FIG. 3 depicts a schematic diagram of one exemplary CVD reactor 300 that may be used to practice portions of the method 100 of FIG. 1. In the embodiment depicted in FIG. 3, the reactor 300 comprises a processing chamber 301, a pumping system 338, a gas panel 336, the power source 208, and the controller 210.

The processing chamber 301 generally includes an upper assembly 303, a bottom assembly 308, and a substrate support lift assembly. The upper assembly 303 generally comprises a lid 310 having an inlet port 334 and a showerhead 344. The bottom assembly 308 houses a substrate support pedestal 324 and comprises a chamber body 302 having a wall 306. A substrate access port 328 is formed in the chamber body 302 to facilitate entry and egress of a substrate 322 into and out of the processing chamber 301. The substrate support lift assembly is coupled to the substrate support pedestal 324 and comprises a lift mechanism 330, a lift plate 318 and a set of lift pins 314.

The substrate support pedestal 324 is disposed in an internal volume 304 of the processing chamber 301 and, during processing, supports the substrate 322. The substrate support pedestal 324 includes a heater 320 configured to regulate the temperature of the substrate 322 and/or temperature in the internal volume 304. The heater 320 is coupled to a power source 208. The heater 320 has a first zone 202 and a second zone 204. The power source 208 provides a first power feed 216 to the first zone 202 and a second power feed 218 to the second zone 204. A resistance measuring device 214 is coupled to the first power feed 216 to measure the current and voltage drawn by the first zone 202.

The showerhead 344 provides, through a plurality of openings 354, distribution of gases or vapors delivered from the gas panel 336. Size, geometry, number, and location of the openings 354 are selectively chosen to facilitate a predefined pattern of gas/vapor flow to the substrate 322.

The gas panel 336 provides process chemicals, in liquid and/or gaseous form, to the processing chamber 301. The gas panel 336 is coupled to the lid 310 using a plurality of gas lines 340. Each gas line 340 may be selectively adapted for transferring specific chemical(s) from the gas panel 336 to the inlet port 334, as well as be temperature controlled.

In operation, the substrate support lift assembly 330 controls the elevation of the pedestal 324 between a processing position (as shown in FIG. 3) and a lowered position from which the substrate 322 may be transported, through the substrate access port 328, into and out of the processing chamber 301. The substrate support lift assembly is sealingly coupled to the chamber body 302 using a flexible bellows 332 and, optionally, is configured to rotate the substrate support pedestal 324.

The wall 306 may be thermally regulated. In one embodiment, a plurality of conduits 312 are disposed in the wall 306 and configured to circulate a heat transfer fluid regulating the temperature of the wall.

The pumping system 338 is coupled to a pumping port 326 formed in the wall 306. The pumping system 338 generally includes a throttle valve and one or more pumps arranged to control the pressure in the internal volume 304. Gases flowing out of the processing chamber 301 are routed through a pumping ring 342 to enhance gas flow uniformity across the surface of the substrate 322. One such pumping ring is described in U.S. patent Ser. No. 10/911,208, filed Oct. 4, 2004, by Iyer, et al., and entitled "Thermal Chemical Vapor Deposition of Silicon Nitride Using BTBAS Bis(Tertiary-Butylamino Silane) in a Single Wafer Chamber."

In alternate embodiments (not shown), the reactor 300 may comprise a photoexcitation system delivering radiant energy to the substrate 322 through windows in the lid 310, as well as a remote plasma source coupled to the inlet port 334.

The controller 210 generally comprises a central processing unit (CPU) 350, a memory 343, and support circuits 352 and is coupled to and controls modules and apparatuses of the reactor 300. In operation, the controller 210 directly controls modules and apparatus of the reactor 300 or, alternatively, administers computers (and/or controllers) associated with these modules and apparatuses. In some embodiments, the controller 210 adjusts the temperature of the first zone 202 by adjusting the first power feed 216 from the power source 208 to the first zone 202 based on the resistance value calculated from the voltage and current drawn by the first zone 202 and measured by the resistance measurement device 214.

Thus, methods and apparatus for processing substrates have been provided herein that provide improved temperature control of a multi-zone heater in a process chamber. Improved temperature control may facilitate improved control over substrate processes that are temperature dependent. For example, improved temperature uniformity may facilitate improvement of substrate processing, such as etching, deposition, or other processes that may benefit from temperature uniformity. In addition, embodiments of the present invention advantageously provide flexibility to have a non-uniform temperature profiles, such as a center cold profile or a center hot profile.

While the foregoing is directed to embodiments of the present invention, other and further embodiments of the invention may be devised without departing from the basic scope thereof.

What is claimed is:
1. An apparatus, comprising:
a multizone heater disposed in a substrate support;
a power source providing a first power feed to a first zone of the multizone heater and providing a second power feed to a second zone of the multizone heater;
a resistance measuring device coupled to the first power feed to simultaneously measure the current and voltage drawn by the first zone; and a controller coupled to the power source and the resistance measuring device to control the power source in response to data received from the resistance measuring device.

2. The apparatus of claim 1, wherein the power source is an about 190 to about 240 VAC power source.

3. The apparatus of claim 1, wherein the multizone heater comprises an inner zone and an outer zone respectively corresponding to a central portion and an outer portion of a substrate to be supported on the substrate support, and wherein the outer zone is the first zone of the multizone heater and the inner zone is the second zone of the multizone heater.

4. The apparatus of claim 1, wherein the power source runs at a 60 Hz cycle.

5. The apparatus of claim 1, wherein a temperature of the second zone of the multizone heater is measured using a thermocouple.

6. The apparatus of claim 5, wherein the thermocouple is coupled to the controller.

7. The apparatus of claim 6, wherein the controller is configured to adjust the temperature of the first zone by adjusting the first power feed from the power source to the first zone based on a resistance value calculated from the voltage and current drawn by the first zone and measured by the resistance measurement device.

8. A substrate processing system, comprising:
a process chamber having an internal volume;
a pumping system;
a gas panel;
a substrate support pedestal disposed within the internal volume of the process chamber, the substrate support pedestal including a multizone heater disposed in a substrate support pedestal;
a power source providing a first power feed to a first zone of the multizone heater and providing a second power feed to a second zone of the multizone heater;
a resistance measuring device coupled to the first power feed to simultaneously measure the current and voltage drawn by the first zone; and
a controller coupled to the power source and the resistance measuring device to control the power source in response to data received from the resistance measuring device.

9. The substrate processing system of claim 8, wherein the power source is an about 190 to about 240 VAC power source.

10. The substrate processing system of claim 8, wherein the multizone heater comprises an inner zone and an outer zone respectively corresponding to a central portion and an outer portion of a substrate to be supported on the substrate support, and wherein the outer zone is the first zone of the multizone heater and the inner zone is the second zone of the multizone heater.

11. The substrate processing system of claim 8, wherein the power source runs at a 60 Hz cycle.

12. The substrate processing system of claim 8, wherein a temperature of the second zone of the multizone heater is measured using a thermocouple.

13. The substrate processing system of claim 12, wherein the thermocouple is coupled to the controller.

14. The substrate processing system of claim 13, wherein the controller is configured to adjust the temperature of the first zone by adjusting the first power feed from the power source to the first zone based on a resistance value calculated from the voltage and current drawn by the first zone and measured by the resistance measurement device.

15. The substrate processing system of claim 8, wherein the multizone heater is configured to regulate at least one of a temperature of a substrate when disposed on the substrate support pedestal or a temperature in the internal volume.

* * * * *